United States Patent
Kim et al.

(10) Patent No.: US 7,420,496 B2
(45) Date of Patent: Sep. 2, 2008

(54) DIGITAL/ANALOG CONVERTING APPARATUS WITH HIGH RESOLUTION

(75) Inventors: Byung Hoon Kim, Seoul (KR); Taek Soo Kim, Kyungki-do (KR); Youn Joong Lee, Seoul (KR); Chan Woo Park, Kyungki-do (KR)

(73) Assignee: Samsung Electro-Machines Co., Ltd., Suwon, Kyungki-Do (KR)

( * ) Notice: Subject to any disclaimer, the term of this patent is extended or adjusted under 35 U.S.C. 154(b) by 0 days.

(21) Appl. No.: 11/565,531

(22) Filed: Nov. 30, 2006

(65) Prior Publication Data

US 2007/0194965 A1 Aug. 23, 2007

(30) Foreign Application Priority Data

Feb. 22, 2006 (KR) .................. 10-2006-0017416

(51) Int. Cl.
*H03M 1/66* (2006.01)
(52) U.S. Cl. ...................... 341/145; 341/144
(58) Field of Classification Search ............... 341/145, 341/144
See application file for complete search history.

(56) References Cited

U.S. PATENT DOCUMENTS 5,731,774 A 3/1998 Fujii et al.

2005/0088329 A1* 4/2005 Tsuchi ................... 341/144
2005/0195098 A1 9/2005 Panov et al.

FOREIGN PATENT DOCUMENTS

| JP | 9-64746 A | 3/1997 |
|---|---|---|
| JP | 2001-044837 A | 2/2001 |
| KR | 2002-0034832 A | 5/2002 |

OTHER PUBLICATIONS

Korean Intellectual Property Office, Office Action issued on Feb. 15, 2007.
Japanese Patent Office, Office Action mailed Dec. 4, 2007 and English Translation.

* cited by examiner

*Primary Examiner*—Rexford Barnie
*Assistant Examiner*—Joseph Lauture
(74) *Attorney, Agent, or Firm*—Lowe Hauptman Ham & Berner

(57) ABSTRACT

A high resolution digital/analog converting apparatus for a spatial optical modulator includes a resistor string including a plurality of resistors connected to each other in series between operating voltage terminals to divide operating voltages into a plurality of voltages using the plural resistors, a decoder to provide switching signals corresponding to digital signals, and a switch unit to select two voltages from the plural voltages divided by the resistor string according to the switching signal of the decoder. The two voltages are adjacent to each other. Moreover, the digital/analog converting apparatus may include a digital/analog converter to perform a digital/analog conversion of the two voltages.

5 Claims, 4 Drawing Sheets

DIGITAL/ANALOG CONVERTING APPARATUS WITH HIGH RESOLUTION

RELATED APPLICATION

The present application is based on, and claims priority from, Korean Application Number 2006-17416, filed Feb. 22, 2006, the disclosure of which is incorporated by reference herein in its entirety.

BACKGROUND OF THE INVENTION

1. Field of the Invention

The present invention relates to a digital/analog converting apparatus applied to a spatial optical modulator (hereinafter, referred to as an "SOM"), and more particularly, to a high resolution digital/analog converting apparatus implemented to provide higher resolution than that obtained using a DAC (for example, an 8-bit DAC) with low resolution, to significantly reduce a size of SOM IC and to be operated at relatively high speed when operating multi-channels.

2. Description of the Related Art

Generally, a spatial optical modulator (SOM) driver IC is used to drive an SOM device. In developing the SOM driver IC, a conventional similar IC, as shown in FIG. 1, outputs a single voltage from a desired gray scale using an 8-bit resolution DAC.

A conventional 8-bit digital/analog converting apparatus will be described with reference to FIGS. 1 and 2.

FIG. 1 is a schematic view illustrating the conventional 8-bit digital-analog converting apparatus. As shown in FIG. 1, the conventional 8-bit digital/analog converting apparatus includes a resistor string 10 having a plurality of resistors R0 to R256 connected to each other in series between two terminals of operating voltages Vd1 and Vd2 and dividing the operating voltages Vd1 and Vd2 using the plural resistors R0 to R256, a decoder 20 to control a DA conversion of converting an 8-bit digital signal into a corresponding analog signal, and a switch unit 30 to select a voltage from voltages VR<0> to VR<256> divided by the resistor string 10 according to a control of the decoder 20.

The decoder 20 includes a first decoder 21 to control a DA conversion of converting a high 4-bit digital signal among 8-bit signals into a corresponding analog signal, and a second decoder 22 to control a DA conversion of converting a lower 4-bit digital signal among the 8-bit digital signals into a corresponding analog signal.

The 8-bit DA converting switch unit 30 includes a voltage group selecting unit 31 to select a single voltage group from a plurality of voltage groups respectively including a predetermined number of voltages divided by the resistor string 10, and a voltage selector 32 to select a single voltage Vout from the voltage group selected by the voltage group selecting unit 31 according to the control of the second decoder 22.

The voltage group selecting unit 31 includes a plurality of group switches GS1 to GS16 to select all of voltages included in the voltage group selected from the plural voltage groups according to the control of the first decoder 21. The voltage selector 32 includes a plurality of switches SW1 to SW16 commonly connected to respective corresponding positions of the plural group switches GS1 to GS16, and selects a single voltage Vout from the selected voltage group by which one of the plural switches SW1 to SW16 is turned on.

FIG. 2 is a schematic view illustrating the 8-bit DA converting switch unit in FIG. 1.

Referring to FIG. 2, the 8-bit DA converting switch unit 30 includes the plural group switches GS1 to GS16, and the plural group switches GS1 to GS16 each respectively include sixteen (16) switches, namely, SW1 to SW16, ..., SW209 to SW224, SW225 to SW240, and SW241 to SW256.

In the conventional digital/analog converting apparatus, if the voltage group selecting unit 31 includes sixteen group switches and the voltage selector 32 includes sixteen switches, since one of 256 voltages can be selected by the 256 switches, the 8-bit ($2^8=256$) DAC is implemented.

When an apparatus higher than the 8-bit digital/analog converting apparatus, namely, a 10-bit digital/analog converting apparatus is implemented using an apparatus such as the conventional 8-bit digital/analog converting apparatus, the 10-bit digital/analog converting apparatus must include four times the number of the resistors and switches of the conventional 8-bit digital/analog converting apparatus. For this reason, the size of the SOM IC using the converting digital/analog converting apparatus is significantly increased so that the conventional digital/analog converting apparatus cannot be used in an SOM IC having a limit in size. Moreover, it is difficult to implement electric circuits and the electric circuits are complicated. Thus, the manufacturing costs of the SOM IC increase.

Further, when the 10-bit digital/analog converting apparatus using the conventional digital/analog converting apparatus, as described above, since the size of the 10-bit digital/analog converting apparatus becomes four times that of the conventional 8-bit digital/analog converting apparatus, the yield thereof is deteriorated. Moreover, since an area of the SOM IC is increased, parasitic components of the SOM IC are increased, and as a result, it is more difficult to guarantee desired superior performance of the SOM IC.

In other words, if a driver IC having 10-bits (1024 level) is implemented using the conventional digital/analog converting apparatus, the number of the resistors used in the resistor string must be a total of 1025 and the number of the switches used in the switch unit 30 becomes 1024. According to this fact, although the total number of the resistors 258 and the total number of the switches is 256 in the conventional 8-bit digital/analog converting apparatus, in the 10-bit digital/analog converting apparatus, the numbers of the resistors and the switches must be increased by four times so that the size of the SOM IC using the 10-bit digital/analog converting apparatus is significantly increased.

Additionally, when the size of the IC chip is increased by four times, the number of the ICs produced from a single wafer is reduced so that the productivity of the IC chip is deteriorated and the manufacturing costs thereof increase.

SUMMARY OF THE INVENTION

Therefore, the present invention has been made in view of the above problems, and it is an aspect of the present invention to provide a high resolution digital/analog converting apparatus implemented to provide higher resolution than that obtained using a digital/analog converting apparatus (for example, an 8-bit digital/analog converting apparatus) with low resolution, to significantly reduce a size of SOM IC and to be operated at relatively high speed when operating multi-channels.

In accordance with the present invention, the above and other aspects can be accomplished by the provision of a high resolution digital/analog converting apparatus including: a resistor string including a plurality of resistors connected to each other in series between operating voltage terminals to divide operating voltages into a plurality of voltages using the plural resistors; a decoder to provide switching signals corresponding to digital signals; and a switch unit to select two voltages from the plural voltages divided by the resistor string according to the switching signal of the decoder.

The switch unit selects two voltages adjacent to each other from the plural voltages divided by the resistor string.

The decoder includes a first decoder to provide a high-bit digital signal among the digital signals as a corresponding first switching signal, and a second decoder to provide a lower-bit digital signal among the digital signals as a corresponding second switching signal.

The switch unit includes a voltage group selecting unit including a plurality of group switches to select the plural voltages divided by the resistor string according to predetermined voltage groups by the first switching signal of the first decoder, and a voltage selecting unit to select two voltages from the voltage group selected by the voltage group selecting unit according to the second switching signal of the second decoder.

Each of the plural group switches includes a main switch to select a predetermined main voltage group from corresponding voltage groups within the plural voltages divided by the resistor string without duplication, and a sub-switch to select a voltage lower by one step as a minimal voltage of the corresponding voltage groups.

The high resolution digital/analog converting apparatus further includes a digital/analog converter to perform a digital/analog conversion of the two voltages selected by the switch unit.

The digital/analog converter includes a 2-bit digital/analog converter to perform a digital/analog conversion of the two voltages selected by the switch unit according to a 2-bit digital signal.

BRIEF DESCRIPTION OF THE DRAWINGS

These and/or other objects and advantages of the present invention will become apparent and more readily appreciated from the following description of the embodiments, taken in conjunction with the accompanying drawings, in which.

DESCRIPTION OF THE PREFERRED EMBODIMENTS

Figure 1:
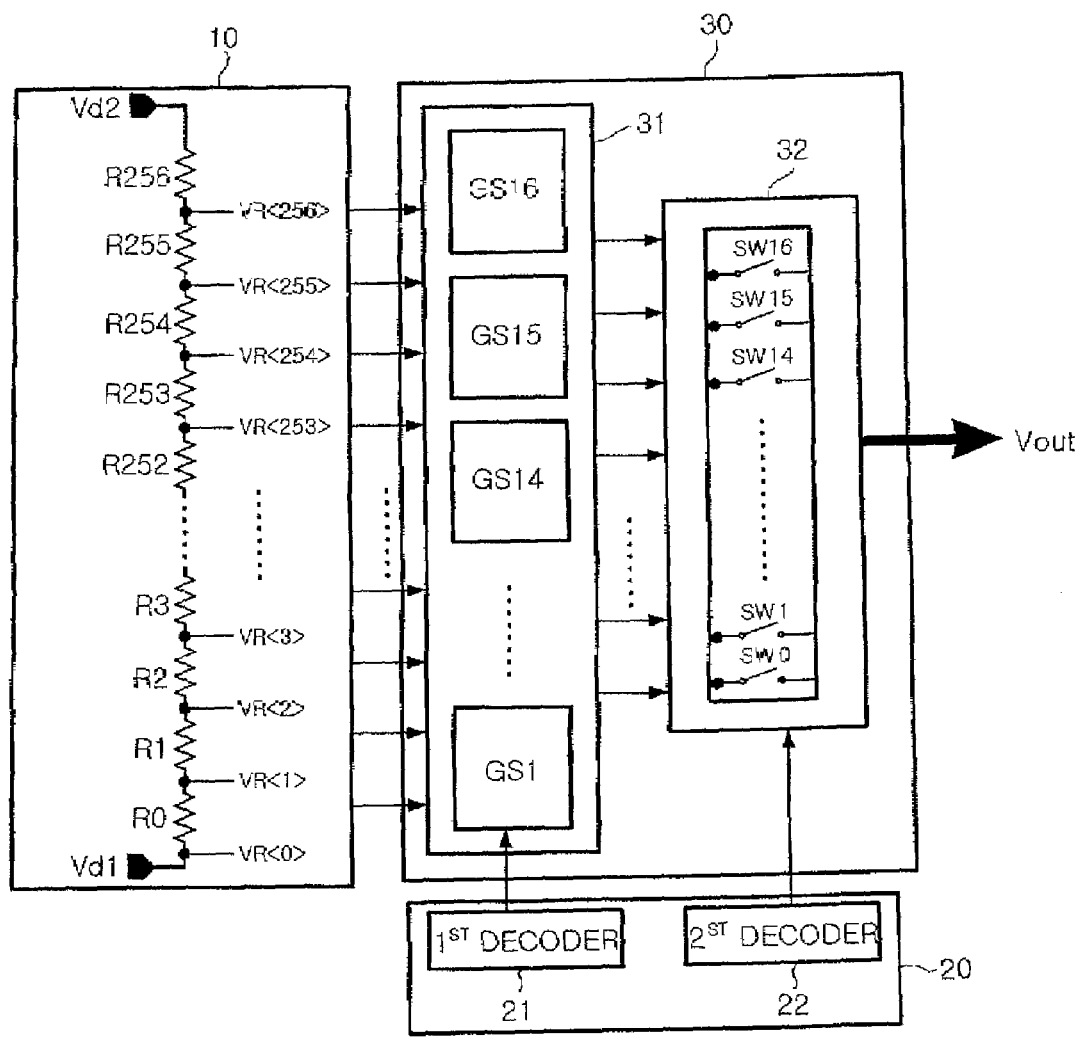
FIG. 1 is a block diagram illustrating a configuration of a conventional 8-bit digital/analog converting apparatus.
Figure 2:
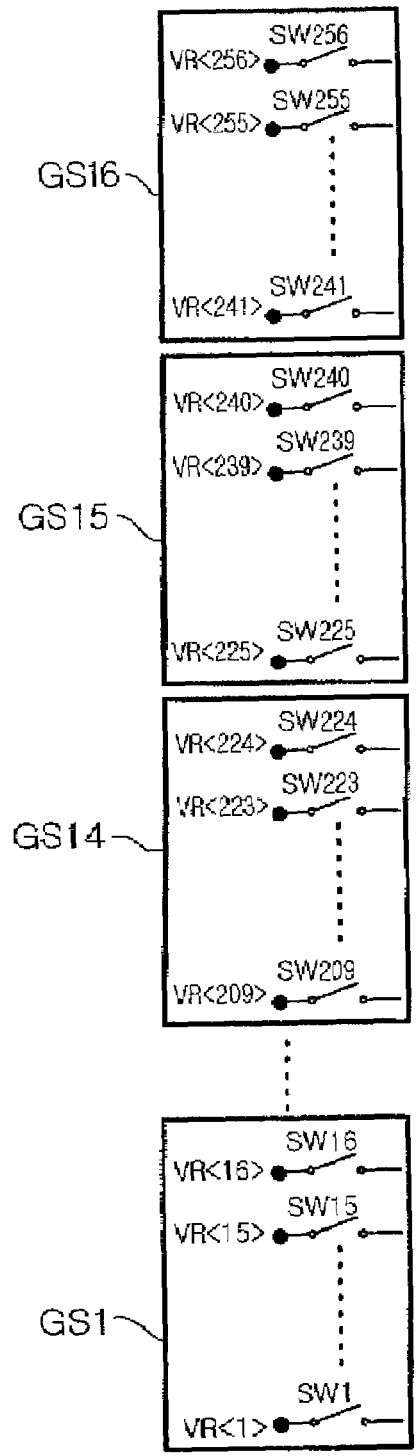
FIG. 2 is a block diagram illustrating a configuration of an 8-bit DAC switch unit in FIG. 1.

Hereinafter, the present invention will be described in detail with reference to the accompanying drawings as follows. Thus, shapes and sizes of components illustrated in the drawings may be exaggerated for the clear description and same reference numeral will be assigned to components having substantially similar function and structure in the drawings.

Figure 3:
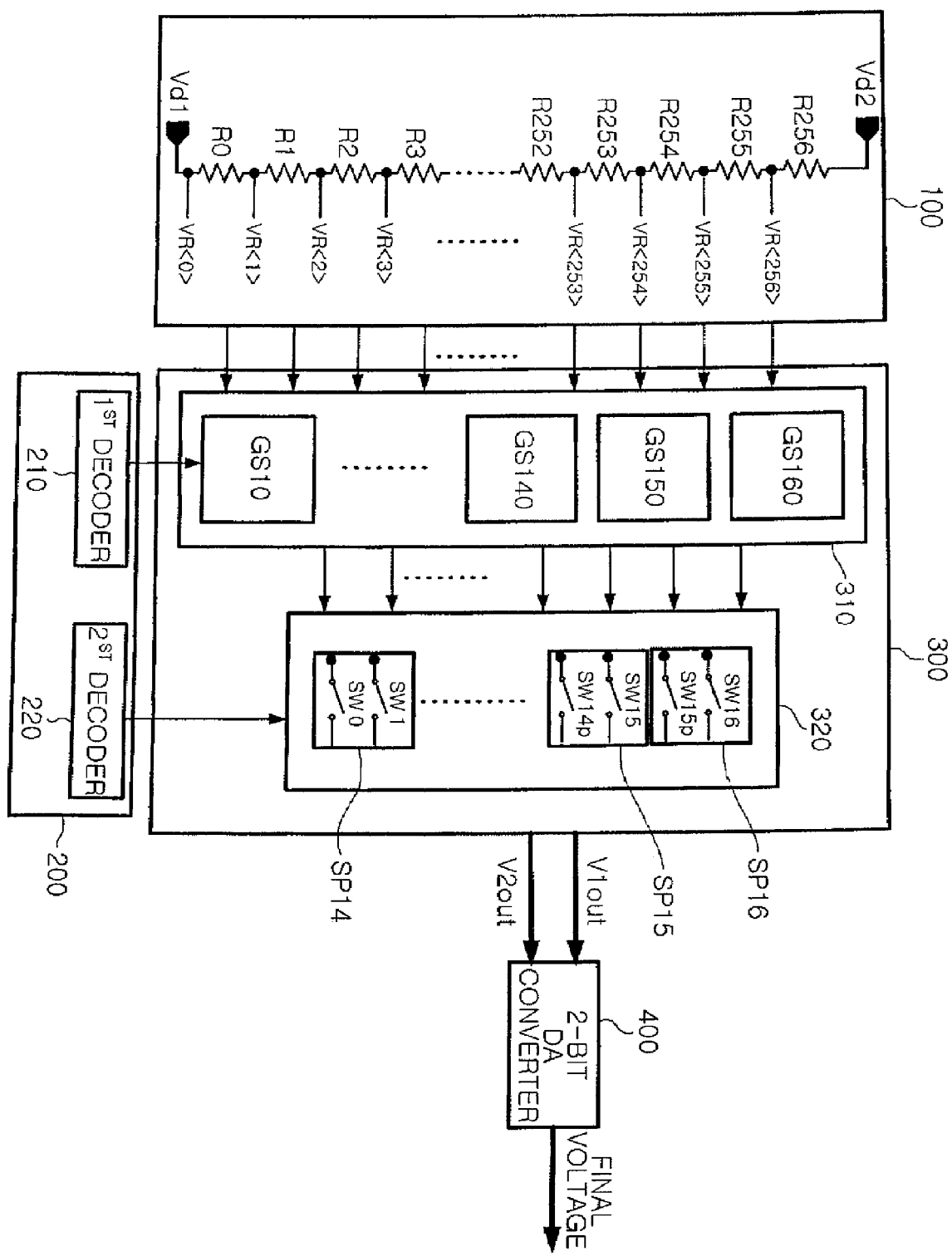
FIG. 3 is a block diagram illustrating a configuration of a digital/analog converting apparatus according to the present invention.

FIG. 3 is a block diagram illustrating a configuration of a digital/analog converting apparatus according to the present invention.

Referring to FIG. 3, the digital/analog converting apparatus according to the present invention includes a resistor string 100, a decoder 200, and a switch unit 300.

The resistor string 100 includes a plurality of resistors connected to each other between two terminals of operating voltages Vd1 and Vd2, divides the operating voltages Vd1 and Vd2 into a plurality of voltages by the plural resistors, and provides the divided voltages to the switch unit 300. For example, in order to implement an 8-bit DA conversion, the resistor string 100 includes 257 resistors R0 to R256 connected to each other in series between the terminals of the operating voltages Vd1 and Vd2, and divides the operating voltages Vd1 and Vd2 into 257 voltages by the 257 resistors R0 to R256.

The decoder 200 decodes a digital signal into a switching signal corresponding to the digital signal and provides the decoded switching signal to the switch unit 300. Here, the digital signal is a source signal decoded into an analog signal.

In more detail, the decoder 200 includes a first decoder 210 to provide a high-bit digital signal from the digital signals as a corresponding first switching signal and a second decoder 220 to provide a lower-bit digital signal from the digital signals as a corresponding second switching signal.

The switch unit 300, according to the switching signals of the decoder 200, selects two voltages V1out and V2out from the plural voltages VR<0> to VR<256> divided by the resistor string 100. Here, the two voltages V1out and V2out are voltages adjacent to each other.

Hereinafter, the switch unit 300 will be described in detail with reference to FIGS. 3 and 4.

Figure 4:
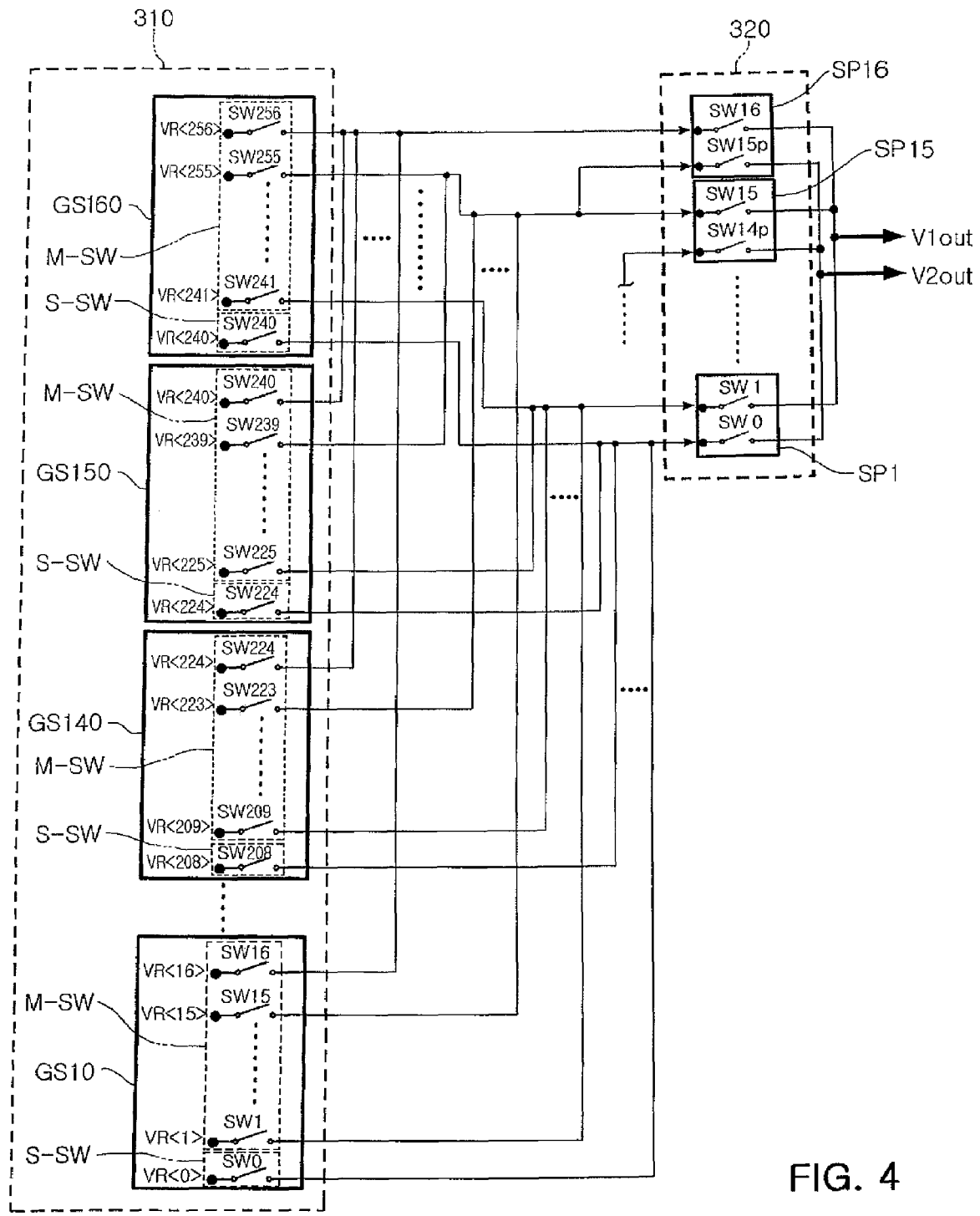
FIG. 4 is a block diagram illustrating a configuration of an 8-bit DAC switch unit in FIG. 3.

FIG. 4 is a block diagram illustrating a configuration of an 8-bit digital/analog converting switch unit in FIG. 3.

Referring to FIGS. 3 and 4, when the switch unit 300 includes a voltage group selecting unit 310 and a voltage selecting unit 320, the voltage group selecting unit 310 includes a plurality of group switches GS10 to GS160 to select the plural voltages VR<0> to VR<256> divided by the resistor string 100 according to predetermined voltage groups by the first switching signal of the first decoder 210.

The voltage selecting unit 320 includes a plurality of switch pairs SP1 to SP16 to select two voltages V1out and V2out from the voltage groups selected by the voltage group selecting unit 310, simultaneously, according to the second switching signal of the second decoder 220.

Further, referring to FIG. 4, each of the plural group switches GS10 to GS160 includes a main switch M-SW to select a predetermined main voltage from a corresponding voltage group among the plural voltages VR<0> to VR<256> divided by the resistor string 100 without duplication, and a sub-switch S-SW to select a voltage lower by one (1) step as a minimal voltage of the corresponding voltage group.

The plural switch pairs SP1 to SP16 include first switches M-SW commonly connected to respective corresponding positions of the plural group switches GS10 to GS160, and second switches S-SW commonly connected to respective corresponding positions having voltages lower by one (1) step as voltages of the positions where the first switches M-SW are connected. Here, the first switches M-SW correspond to sixteen switches SW1 to SW16, and the second switches S-SW correspond to switch SW0 and switches SW1p to SW15p further connected to the switches SW1 to SW15.

Additionally, referring to FIG. 3, the digital/analog converting apparatus according to the present invention further includes a digital/analog converter 400 to perform the digital-to-analog conversion of the two voltages V1out and V2out selected by the switches 300. The digital/analog converter 400 may be a 2-bit digital/analog converter to perform the digital-to-analog conversion of the two voltages V1out and V2out selected by the switch unit 300 according a 2-bit digital signal.

Operation and effect of the digital/analog converting apparatus according to the present invention will be described in detail with reference the accompanying drawings.

In the present invention, a simple 10-bit digital/analog converting apparatus is implemented. The 10-bit digital/analog converting apparatus can exhibit quadruple resolution without significant increase in comparison to the conventional 8-bit digital/analog converting apparatus, for example, can perform a 10-bit digital/analog conversion by selecting and outputting two adjacent voltages in an 8-bit digital/analog converting apparatus and by performing a 2-bit digital/analog conversion of the two adjacent voltages in a 2-bit digital/analog converting apparatus.

The digital/analog converting apparatus according to the present invention will be described in detail with reference to FIGS. 3 and 4.

As shown in FIGS. 3 and 4, in the digital/analog converting apparatus according to the present invention, the resistor string 100 includes the plural resistors R0 to R256 connected to each other in series between the terminals of the operating voltages Vd1 and Vd2, and divides the operating voltages Vd1 and Vd2 into the plural voltages VR<0> to VR<256> by the plural resistors R0 to R256.

Moreover, referring to FIG. 3, the decoder 200 decodes the digital signal into the switching signal and provides the decoded switching signal to the switch unit 300. This will be described in detail as follows. When the decoder 200 includes the first decoder 210 and the second decoder 220, the first decoder 210 decodes a high-bit digital signal from the digital signals into a corresponding first switching signal and provides the first switching signal to the switch unit 300, and the second decoder 220 decodes a lower-bit digital signal from the digital signals into a corresponding second switching signal and provides the second switching signal to the switch unit 300.

At that time, the switch unit 300, according to the switching signals of the decoder 200, selects the two voltages V1out and V2out from the plural voltages VR<0> to VR<256> divided by the resistor string 100. Here, the two voltages V1out and V2out are voltages adjacent to each other.

With reference to FIGS. 3 and 4, operation of the switch unit 300 according to the first and second switching signals of the decoder 200 when the switch unit 300 includes the voltage group selecting unit 310 and the voltage selecting unit 320 will be described in detail.

Firstly, as shown in FIG. 3, each of the plural group switches GS10 to GS160 included in the voltage group selecting unit 310 select the plural voltages VR<0> to VR<256> divided by the resistor string 100 by the predetermined voltage groups according to the first switching signal of the first decoder 210.

With reference to FIGS. 3 and 4, for example, when the resistor string 100 divides the operating voltages into the 257 voltages VR<0> to VR<256> by the resistors R0 to R256 and provides the divided voltages VR<0> to VR<256>, a first group switch GS10 selects a first voltage group including first to seventeenth voltages VR<0> to VR<16>, and in the same way, a fourteenth group switch GS140 selects a fourteenth voltage group including two-hundred-ninth to two-hundred-twenty-fifth voltages VR<208> to VR<224>, a fifteenth group switch GS150 selects a fifteenth voltage group including two-hundred-twenty-fifth to two-hundred-forty-first voltages VR<224> to VR<240>, and a sixteenth group switch GS160 selects a sixteenth voltage group including two-hundred-forty-first to two-hundred-fifty-sixth voltages VR<240> to VR<256>.

Here, when the first switching signal is a 4-bit '1110', the fifteenth voltage group VR<224> to VR<240> can be selected.

Moreover, when each of the plural group switches GS10 to GS160 includes the main switch M-SW and the sub-switch S-SW, each of the main switches M-SW selects a predetermined main voltage group from corresponding voltage groups within the plural voltages divided by the resistor string 100 without duplication. Each of the sub-switches S-SW selects a voltage lower by one (1) step as the minimal voltage of the corresponding voltage groups.

For example, when the voltage group including the two-hundred-forty-first voltage VR<240> to the two-hundred-fifty-seventh voltage VR<256> are selected, the two-hundred-forty-second voltage VR<241> to the two-hundred-fifty-seventh voltage VR<256> are selected by the main switch M-SW, and the two-hundred-forty-first voltage VR<240> is selected by the sub-switch S-SW.

Due to the operations of the plural group switches GS10 to GS160, from the selected voltage groups, the main voltage group of the respective corresponding voltage groups and voltages lower by one (1) step as the minimal voltages of the main voltage groups are selected and outputted.

For example, the main voltage group VR<1> to VR<16> is selected and additionally the first voltage VR<0> is further selected in the voltage group including the first to seventeenth voltages VR<0> to VR<16>, the two-hundred-ninth voltage VR<208> is selected in addition to the main voltage group VR<209> to VR<224> in the voltage group including the two-hundred-ninth to two-hundred-twenty-fifth voltages VR<208> to VR<224>, the two-hundred-twenty-fifth voltage VR<224> is selected in addition to the main voltage group VR<225> to VR<240> in the voltage group including the two-hundred-twenty-fifth to two-hundred-forty-first voltages VR<224> to VR<240>, and the two-hundred-forty-first voltage VR<240> is selected in addition to the main voltage group VR<241> to VR<256> in the voltage group including the two-hundred-forty-first to two-hundred-fifty-seventh voltages VR<240> to VR<256>.

As such, the selection of the voltages in addition to the selection of every two voltages from respective voltage groups is to select and output one of the adjacent two voltages selected from the respective voltage groups.

Next, operation of the voltage selecting unit 320 will be described with reference to FIG. 3.

The voltage selecting unit 320 selects two voltages V1out and V2out from the plural voltages included in the voltage group selected by the voltage group selecting unit 310 according to the second switching signal of the second decoder 220.

Here, the two voltages V1out and V2out are voltages adjacent to each other and divided by resistors of the resistor string 100 adjacent to each other.

Moreover, as shown in FIG. 4, when the voltage selecting unit 320 includes a plurality of switch pairs SP1 to SP16, each of the plural switch pairs SP1 to SP16 selects two voltages V1out and V2out from the voltage group selected by the voltage group selecting unit 310 simultaneously according to the second switching signal of the second decoder 220.

When the plural switch pairs SP1 to SP16 include the first switches M-SW and the second switches S-SW, the first switches M-SW select voltages commonly supplied to respective corresponding positions of the plural group switches GS10 to GS160. In other words, the first switches M-SW of the sixteenth switch pair SP16 select voltages VR<256>, VR<240>, . . . , VR<16> corresponding to every sixteenth position of the plural group switches GS10 to GS160.

Next, the second switches S-SW of the respective switch pairs SP1 to SP16 select voltages which are supplied to respective corresponding positions and lower by one (1) step as the voltages at the positions connected to the first switches M-SW. In other words, when the every voltage VR<256>, VR<240>, . . . , VR<16> at the every sixteenth position of the plural group switches GS10 to GS160 is selected, the second switches S-SW select the voltages VR<255>, VR<239>, . . . , VR<15> at the every fifteenth position.

For example, when the fifteenth voltage group VR<224> to VR<240> is selected by the first switching signal of 4-bit '1110', if the second switching signal is 4-bit '0010', a voltage VR<224> is selected from the fifteenth voltage group VR<224> to VR<240>.

On the other hand, the digital/analog converting apparatus according to the present invention can perform an 8-bit higher digital/analog converting function with a similar size as the 8-bit signal. For example, in the 10-bit digital/analog converting function of the digital/analog converting apparatus according to the present invention, a single voltage is not outputted like the conventional 8-bit digital/analog converting method, but two adjacent voltages are outputted.

In this case, the two outputted voltages indicate voltages at a higher node and a lower node of the resistor string where desired voltages exist. In order to divide a voltage between the two voltages V1out and V2out into four equal voltages, a 2-bit digital/analog converter 400 can be added to a next node thereof.

As described above, according to the present invention, in a digital/analog converting apparatus applied to a spatial optical modulator (SOM), the digital/analog converting apparatus is implemented to provide a high resolution using a low resolution digital/analog converting apparatus (for example, an 8-bit digital/analog converting apparatus) so that a size of the SOM driver IC is significantly reduced and a relatively high rate operation is enabled during operation of multi-channel.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A high resolution digital/analog converting apparatus comprising:
   a resistor string including a plurality of resistors connected to each other in series between operating voltage terminals to divide operating voltages into a plurality of voltages using the resistors;
   a decoder to provide switching signals corresponding to digital signals; and
   a switch unit to select two voltages from the voltages divided by the resistor string according to the switching signals of the decoder;
   wherein the decoder comprises:
   a first decoder to provide a high-bit digital signal among the digital signals as a corresponding first switching signal; and
   a second decoder to provide a lower-bit digital signal among the digital signals as a corresponding second switching signal;
   wherein the switch unit comprises a voltage group selecting unit including a plurality of group switches to select, according to the first switching signal of the first decoder, predetermined non-overlapping voltage groups from the voltages divided by the resistor string; and
   wherein each of the group switches comprises:
   a main switch to select a predetermined main voltage group from the corresponding voltage group; and
   a sub-switch to select a voltage lower by one step than a minimal voltage of the corresponding main voltage group.

2. The high resolution digital/analog converting apparatus according to claim 1, wherein the switch unit selects two voltages adjacent to each other from the voltages divided by the resistor string.

3. The high resolution digital/analog converting apparatus according to claim 1, wherein the switch unit further comprises:
   a voltage selecting unit to select two voltages from the voltage group selected by the voltage group selecting unit according to the second switching signal of the second decoder.

4. The high resolution digital/analog converting apparatus according to claim 1, further comprising a digital/analog converter to perform a digital/analog conversion of the two voltages selected by the switch unit.

5. The high resolution digital/analog converting apparatus according to claim 4, wherein the digital/analog converter comprises a 2-bit digital/analog converter to perform a digital/analog conversion of the two voltages selected by the switch unit according to a 2-bit digital signal.

* * * * *